United States Patent [19]

Brodsky et al.

[11] Patent Number: 5,759,047
[45] Date of Patent: Jun. 2, 1998

[54] FLEXIBLE CIRCUITIZED INTERPOSER WITH APERTURED MEMBER AND METHOD FOR MAKING SAME

[75] Inventors: William Louis Brodsky, Binghamton; Glenn Lee Kehley, Endicott; Glenn Edward Myrto, Binghamton; John Henry Sherman, Lisle, all of N.Y.

[73] Assignee: International Business Machines Corporation, Armonk, N.Y.

[21] Appl. No.: 653,214

[22] Filed: May 24, 1996

[51] Int. Cl.[6] .................................................. H01R 9/09
[52] U.S. Cl. .................................................. 439/66; 439/67
[58] Field of Search .......................... 439/66, 67, 91, 439/591; 29/848

[56] References Cited

U.S. PATENT DOCUMENTS

| | | | |
|---|---|---|---|
| 3,967,162 | 6/1976 | Ceresa | 439/66 |
| 3,971,610 | 7/1976 | Buchoff et al. | |
| 4,050,756 | 9/1977 | Moore | |
| 4,413,308 | 11/1983 | Brown | 361/749 |
| 4,548,451 | 10/1985 | Benarr et al. | 439/66 |
| 4,636,015 | 1/1987 | Ford, Jr. | 439/95 |
| 4,766,371 | 8/1988 | Moriya | 439/66 |
| 4,954,878 | 9/1990 | Fox et al. | |
| 4,991,290 | 2/1991 | MacKay | |
| 5,033,675 | 7/1991 | Shino | |
| 5,041,183 | 8/1991 | Nakamura et al. | |
| 5,069,628 | 12/1991 | Crumly | 439/67 |
| 5,095,628 | 3/1992 | McKenney et al. | |
| 5,147,208 | 9/1992 | Bachler | |
| 5,207,585 | 5/1993 | Byrnes et al. | |
| 5,248,261 | 9/1993 | Conroy-Wass et al. | 439/67 |
| 5,261,826 | 11/1993 | Leeb et al. | 439/67 |

OTHER PUBLICATIONS

IBM Technical Disclosure Bulletin, Dunman, vol. 7, No. 3, p. 182, Aug. 1964.

Research Disclosure, Kenneth Mason Publications, Ltd, England, No. 344, 117, Dec. 1992.

*Primary Examiner*—Neil Abrams
*Attorney, Agent, or Firm*—Lawrence R. Fraley

[57] ABSTRACT

A flexible circuitized interposer (50) and method of making same wherein the interposer includes at least one flexible circuitized substrate (53) having a dielectric (e.g., polyimide) layer (54) with a conductor (55) and plated elements (56), e.g., copper pad, including possibly with dendrites (57) thereon for enhanced connection, an apertured support member (58) aligning with the conductor, and a support member (60) having the apertured member thereon. When the interposer is engaged, the flexible circuitized substrate (53) is depressed within the aperture (59). Various alternatives, including a support (60") formed with compressible portions (69) that extend into respective apertures (59) in the support member (58), and an interim, compressible support (60""), are disclosed. The support member may also be metallic, e.g., for use as an electrical ground shield. Flexure is also enhanced by utilization of patterns of one or more apertures (64) in the flexible substrate relative to and substantially surrounding the positioned conductors (56). Electrical assemblies including a pair of circuitized substrates electrically interconnected by the defined interposers are also described.

40 Claims, 11 Drawing Sheets

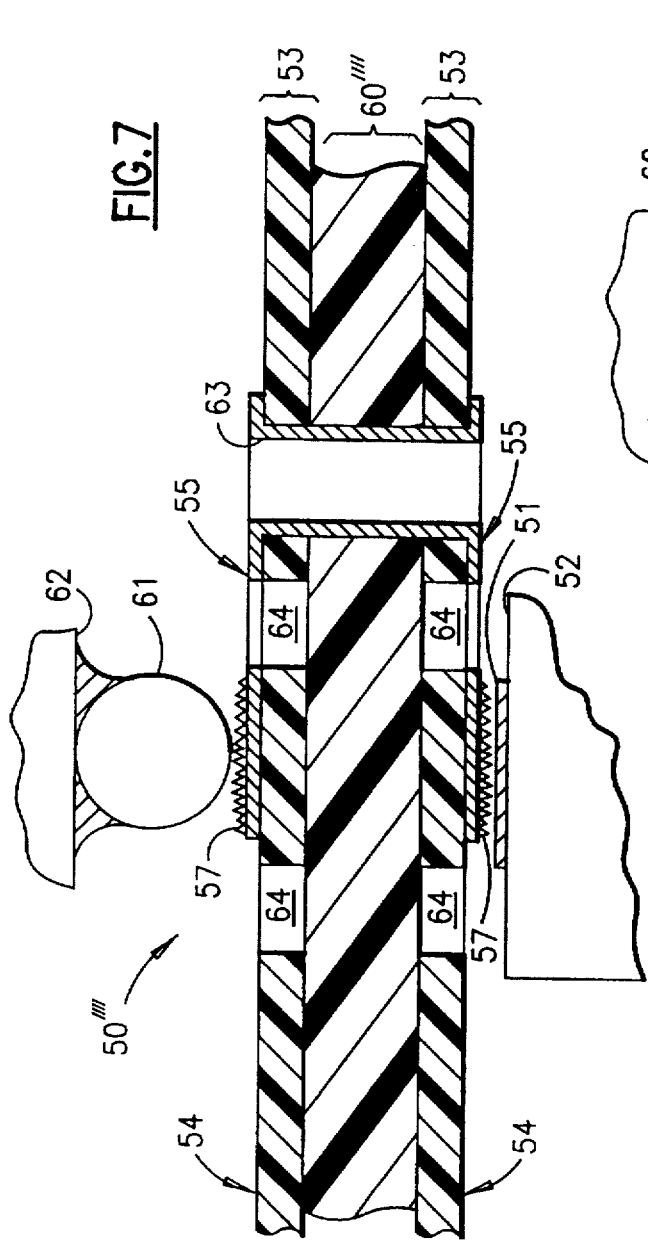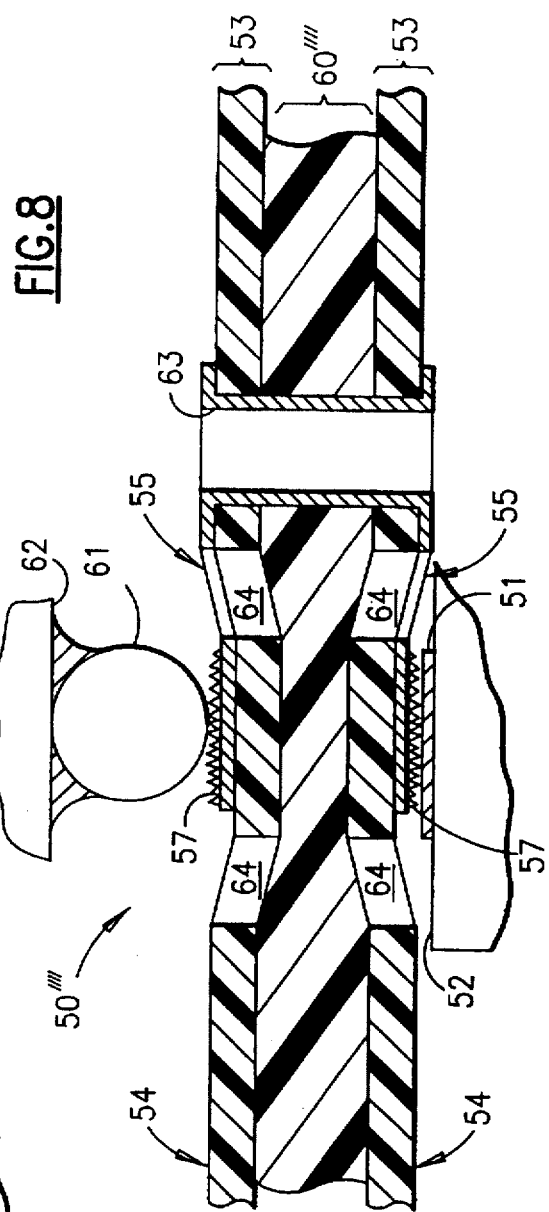

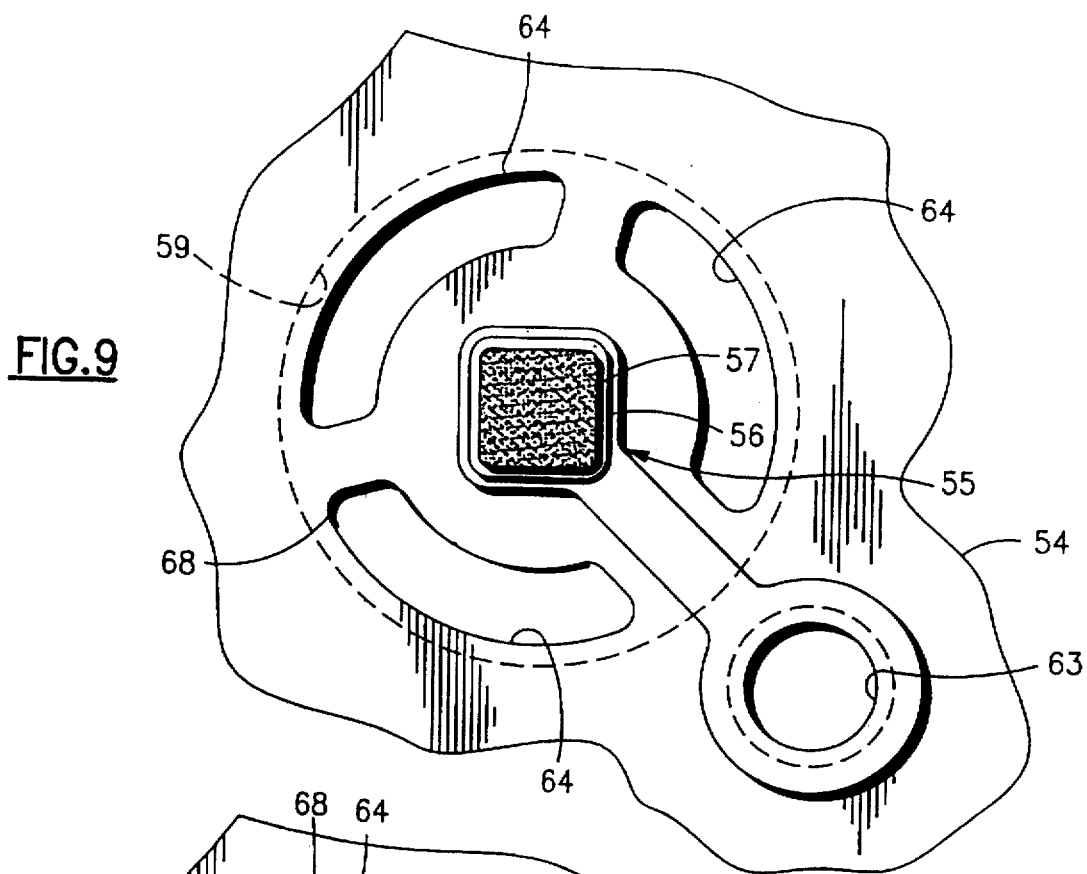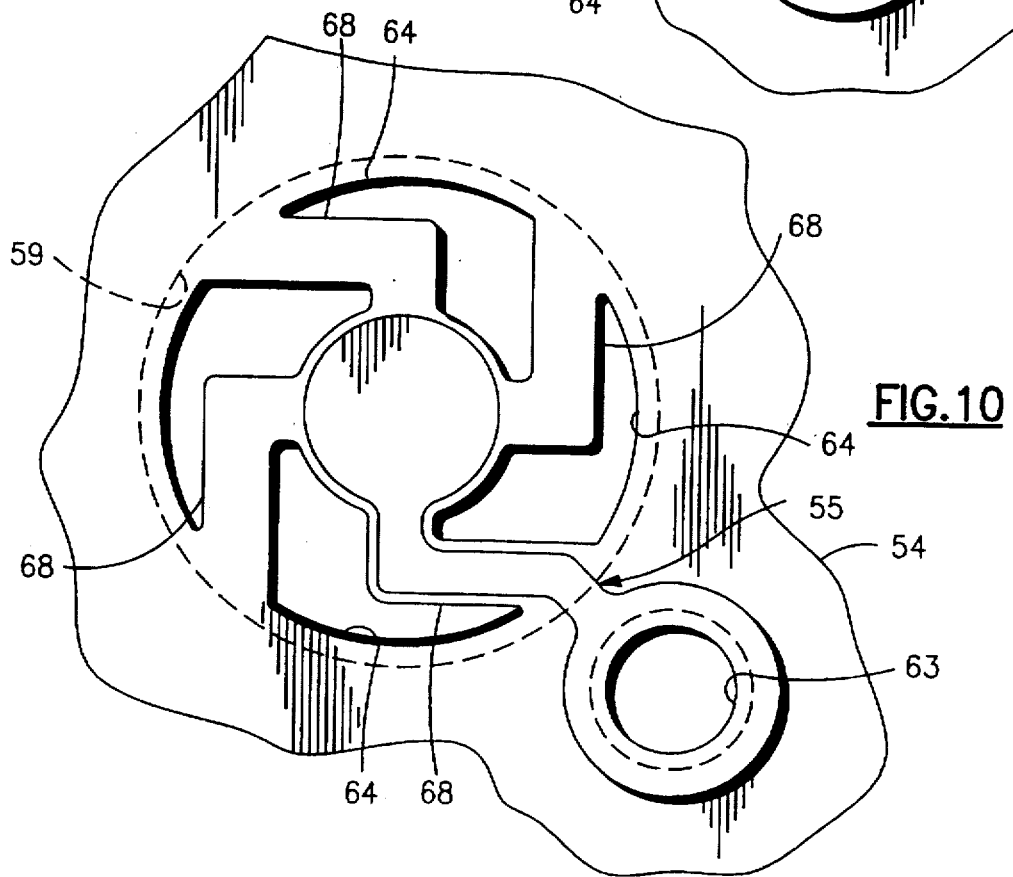

FLEXIBLE CIRCUITIZED INTERPOSER WITH APERTURED MEMBER AND METHOD FOR MAKING SAME

TECHNICAL FIELD

This invention relates to electrical interconnectors and particularly to such interconnectors for electrically connecting a semiconductor device or similar electronic structure to a circuitized substrate member or the like. In particular, the invention relates to an interconnector which can be readily positioned between the structures being connected while assuring effective connection therebetween.

BACKGROUND OF THE INVENTION

Semiconductor devices and other electronic components (e.g., chip carriers) have been connected to circuitized substrates such as printed circuit boards (e.g., for computers) using a variety of methods, including conductive pins, wirebonds, solder balls and/or columns, compressible leads, etc. In some embodiments, the conductive elements (e.g., leads) have been positioned within an interposer housing. In others, an insulative housing including a semiconductor chip therein has been used, with projecting leads or pins soldered to the circuitized substrate or inserted within receiving conductive openings (e.g., plated through holes) in the substrate. One example of the latter is a dual-in-line (dip) package. Several other examples are also known, some of which are described in the documents cited hereinbelow.

For example, U.S. Pat. Nos. 3,971,610 (Buchoff, et al), 4,050,756 (Moore), 5,033,675 (Shino), and 5,261,826 (Leeb, et al) also discuss various types of interconnectors using conductive elastomer contacts, including use of such contacts to provide electrical connection between two components such as a semiconductor device (chip) and printed circuit board. The resistivity of such conductive elastomer elements can be dependent on the force applied to such elements, the amount of filler material as well as type of filler, etc. Such variables can have a significant impact on the functionality of an electronic assembly built with these elements. U.S. Pat. No. 4,548,451 (Benarr, et al), assigned to the assignee of the instant invention, defines an elastomeric core—flexible circuit member type of interconnection wherein the flexible circuit is subjected to a non-zero mean stress with a cyclic stress applied during actuation or mating (e.g., to a semiconductor device and printed circuit board). Such a form of stress may shorten the fatigue life of the circuit lines on the flexible circuit, thereby possibly resulting in a failed connection. U.S. Pat. No. 4,954,878 (Fox, et al) discusses a interposer system in which a single layer interposer forms an electrical connection between a chip and substrate. The ability of such a system to accommodate manufacturing tolerances of the components being connected is limited by the compressibility of the various components in the system. U.S. Pat. No. 5,041,183 (Nakamura, et al) discusses a method of fabricating an interposer using hot melt adhesive. Such application of hot melt adhesive is of course limited to use at a temperature less then the melting point of the adhesive, thus limiting the temperature range in which this device can be utilized. U.S. Pat. No. 5,207,585 (Byrnes et al) also assigned to the instant invention's assignee, defines a flexible circuit member having raised features for being imbedded into solder balls such as might be used on a semiconductor device and/or printed circuit board. The flexible circuit member forms a membrane member with associated in-plane stresses. These stresses limit the amount of possible out-of-plane deflection when a given force is applied to one or more of the contact members.

Other patents that also discuss various types of electronic packaging interconnection structures include U.S. Pat. No. 4,991,290 (MacKay), U.S. Pat. No. 5,069,628 (Crumly), U.S. Pat. No. 5,095,628 (McKenney, et al), U.S. Pat. No. 5,147,208 (Bachler), and U.S. Pat. No. 5,248,261 (Conroy-Wass, et al).

Recently, as packaging requirements have increased, it has been found that solder coupling can be effectively used in relatively high density applications. Various packaging structures (e.g., those referred to in the art as "ball grid array" packages) have been successfully developed, particularly by the assignee of the present invention. An example of such a structure is defined in U.S. Pat. No. 5,435,732 (Angulas et al), assigned to the assignee of the instant invention. Such an example is also referred to in the industry as a tape ball grid array, or "TBGA". Other ball grid array packages are presently being used in the industry, including those referred to as ceramic ball grid array ("CBGA") and plastic ball grid array ("PBGA") packages.

As defined herein, the interconnector of the present invention is particularly adapted for providing sound, effective interconnection between electronic components such as high density ball grid array packages and a receiving circuitized substrate such as a printed circuit board. Such a connection is possible with effective tolerance compensation for the components being connected. The structure of the invention is attainable using known materials in the industry (e.g., dielectric and conductive pad/line materials) and thus assures a cost savings for the finished product.

It is of course understood that the invention is not limited to array package-circuit board types of connections but instead can be readily adapted to many other forms of connection, including board-to-board, pad-to-pad, etc.

It is believed that an interconnector possessing the aforedefined advantageous features and others discernible from the teachings herein would constitute an advancement in the art.

SUMMARY OF THE INVENTION

It is an object of the invention to enhance the electrical connector art by providing an interconnector possessing the several distinctive advantages cited herein.

It is another object of the invention to provide a method of making such an interconnector.

It is yet another object to provide both a structure and method which are relatively inexpensive to make and perform, respectively, and which are adaptable to mass production procedures.

In accordance with one aspect of the invention, there is provided an interposer for electrically interconnecting first and second conductors on first and second circuitized substrates, the interposer comprising at least one flexible circuitized substrate adapted for being electrically coupled to the first conductor on the first circuitized substrate and including a first layer of dielectric material having at least one conductive member thereon adapted for engaging the second conductor on the second circuitized substrate to provide an electrical connection with the second conductor. An apertured member is also provided including at least one aperture therein, the apertured member being positioned adjacent the at least one flexible circuitized substrate such that the at least one aperture is aligned with the at least one conductive member of the at least one flexible circuitized substrate on an opposite side of the flexible circuitized substrate from the conductive member. The apertured member is a separate member from the at least one flexible circuitized substrate. A support member positioned adjacent the apertured member and having the apertured member positioned thereon is also provided, the at least one conductive member of the at least one flexible circuitized substrate adapted for being depressed within the aperture of the apertured member during the engagement between the conductive member and the first conductor of the first circuitized substrate.

According to another aspect of the invention, there is provided an interposer for electrically interconnecting first and second conductors on first and second circuitized substrates, the interposer comprising at least one flexible circuitized substrate adapted for being electrically coupled to the first conductor on the first circuitized substrate and including a first layer of dielectric material having at least one conductive member thereon adapted for engaging the second conductor on the second circuitized substrate to provide an electrical connection with the second conductor. The interposer further includes an apertured member including a layer of dielectric material having an aperture therein, the aperture being positioned adjacent the at least one flexible circuitized substrate such that the aperture is aligned with the at least one conductive member of the at least one flexible circuitized substrate on an opposite side of the flexible circuitized substrate from the conductive member. The apertured member is a separate member from the at least one flexible circuitized substrate, and further includes a conductor member extending through the dielectric material of the apertured member, the conductive member of the at least one flexible circuitized substrate being electrically coupled to the conductor member and adapted for being depressed within the aperture of the apertured member during the engagement between the conductive member and the second conductor of the second circuitized substrate.

According to yet another embodiment of the invention, there is provided an interposer for electrically interconnecting first and second conductors on first and second circuitized substrates, the interposer comprising first and second flexible circuitized substrates each including at least one layer of dielectric material having at least one conductive member positioned on the layer of dielectric material and adapted for engaging a respective one of the first and second conductors of the first and second circuitized substrates, respectively. The layers of the dielectric material of both the first and second flexible circuitized substrates each include a conductor member extending through the layer of dielectric material wherein the layer of dielectric material of the first and second flexible circuitized substrates includes a plurality of openings therein spaced in a predetermined pattern relative to the at least one conductive member. A support member is also used and positioned between the first and second flexible circuitized substrates, the support member being a separate member from both of the flexible circuitized substrates, and also being compressible such that the support member will compress during engagement between the first and second conductive members of the first and second flexible circuitized substrates and the first and second conductors of the first and second circuitized substrates, respectively. The support member includes a conductor extending therethrough and electrically coupled to both the first and second conductor members of the first and second flexible circuitized substrates.

According to still another aspect of the invention, there is provided a method of making an interposer for electrically interconnecting first and second conductors on first and second circuitized substrates, respectively, the method comprising the steps of providing at least one flexible circuitized substrate adapted for being electrically coupled to the first conductor on the first circuitized substrate and including a first layer of dielectric material having at least one conductive member thereon adapted for engaging the second conductor on the second circuitized substrate to provide an electrical connection with the second conductor. An apertured member is provided including at least one aperture therein, the apertured member being positioned adjacent the at least one flexible circuitized substrate such that the at least one aperture is aligned with the one conductive member of the at least one flexible circuitized substrate on an opposite side of the flexible circuitized substrate from the conductive member. The provided apertured member is a separate member from the at least one flexible circuitized substrate. A support member is provided and positioned adjacent the apertured member and has the apertured member positioned thereon, the at least one conductive member of the at least one flexible circuitized substrate adapted for being depressed within the aperture of the apertured member during the engagement between the conductive member and the first conductor of the first circuitized substrate.

According to another embodiment of the invention, a method of making an interposer for interconnecting first and second conductors on first and second circuitized substrates is provided wherein the method comprises the steps of providing at least one flexible circuitized substrate adapted for being electrically coupled to the first conductor on the first circuitized substrate and including a first layer of dielectric material having at least one conductive member thereon adapted for engaging the second conductor on the second circuitized substrate to provide an electrical connection with the second conductor, providing an apertured member including at least one aperture therein, positioning the apertured member adjacent the at least one flexible circuitized substrate on an opposite side of the flexible circuitized substrate from the conductive member, the apertured member being a separate member from the at least one flexible circuitized substrate, providing a conductor extending through the apertured member and electrically coupling the conductor to the conductive member of the at least one flexible circuitized member, and positioning the apertured member such that the at least one flexible circuitized substrate may be depressed within the aperture of said apertured member during engagement between the conductive member and the second conductor of the second circuitized substrate.

According to yet another object of this invention, there is provided a method of making an interposer comprising the steps of providing first and second flexible circuitized substrates each including at least one layer of dielectric material having at least one conductive member positioned on the layer of dielectric material and adapted for engaging a respective one of the first and second conductors of the first and second circuitized substrates, respectively. The layers of the dielectric material of both the first and second flexible circuitized substrates each include a conductor member extending through the layer of dielectric material wherein the layer of dielectric material of the first and second flexible circuitized substrates also includes a plurality of openings therein spaced in a predetermined pattern relative to the at least one conductive member. A support member is positioned between the first and second flexible circuitized substrates, the support member being a separate member from both of the flexible circuitized substrates, the support member being compressible such that the support member will compress during engagement between the first and second conductive members of the first and second flexible circuitized substrates and the first and second conductors of the first and second circuitized substrates, respectively. The support member further includes a conductor extending therethrough which is electrically coupled to both the first and second conductor members of the first and second flexible circuitized substrates.

BRIEF DESCRIPTION OF THE DRAWINGS

FIG. 7 is a partial, cross-sectional view of a interposer structure in accordance with still another embodiment of the invention, this structure shown at the point of initial contact with the components being connected;

FIG. 8 shows the structure of FIG. 7 in an actuated state; and

FIGS. 9–17 are much enlarged plan views of different opening patterns capable of being used in the flexible circuit member of the present invention.

BEST MODE FOR CARRYING OUT THE INVENTION

For a better understanding of the present invention, together with other and further objects, advantages and capabilities thereof, reference is made to the following disclosure and appended claims in connection with the above-described drawings. Like numerals will be used from FIG. To FIG. to illustrate like elements.

Figure 1:
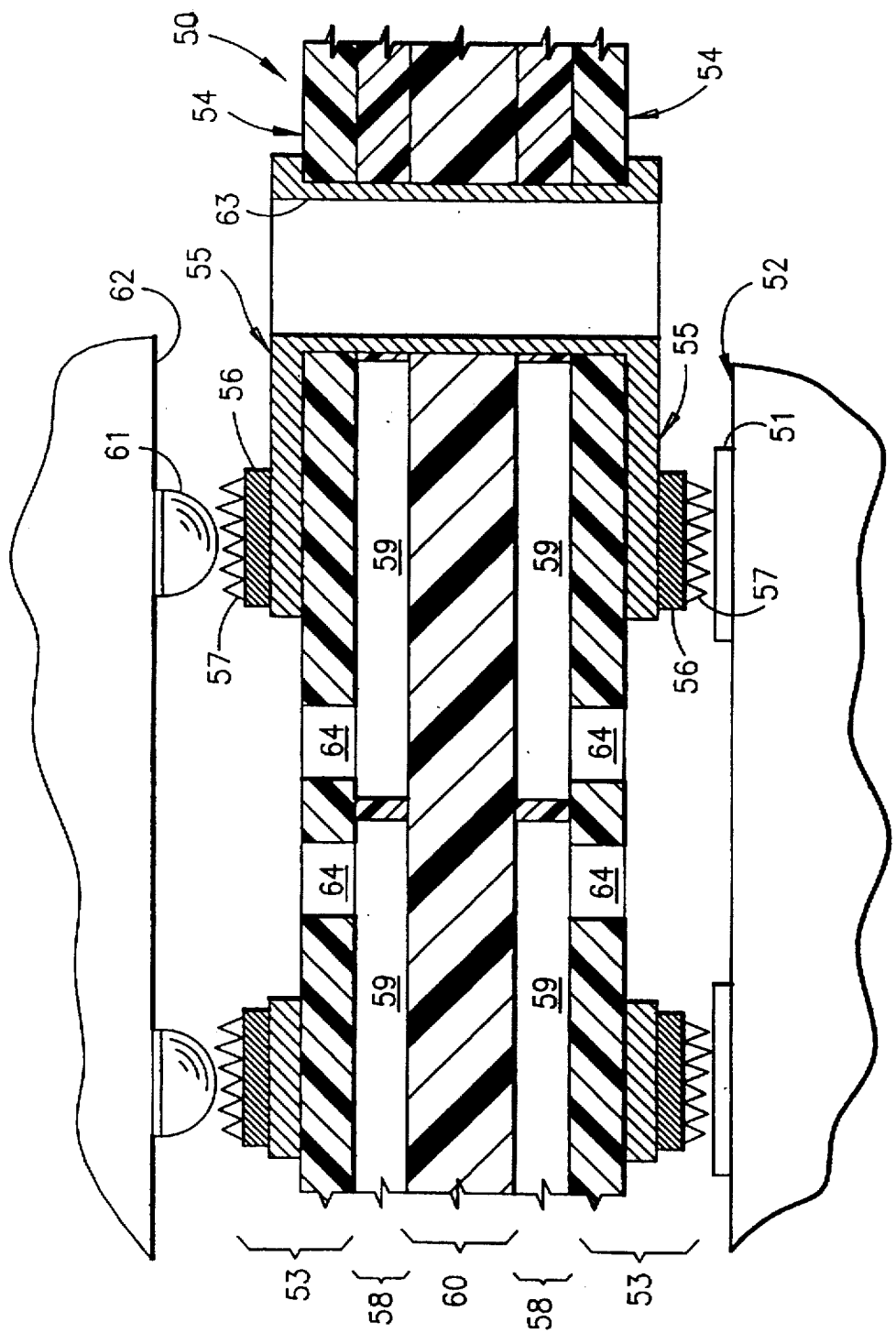
FIG. 1 is a partial, cross-sectional view, on a much enlarged scale, of an apertured interposer structure in accordance with one aspect of the invention, showing the invention at the initial stage of contact between the components being connected.

FIG. 1 shows the interposer 50 for electrically interconnecting first and second conductors 51 and 61, positioned on first and second circuitized substrates 52 and 62, respectively, to thereby form an electrical assembly, e.g., for use in an information handling system such as a computer. Interposer 50 comprises at least one flexible circuitized substrate 53 of dielectric material 54 including at least one conductive member 55. Conductive members 55 of flexible circuitized substrate 53 may be formed on dielectric material 54 using conventional photolithographic processes. The attachment between conductive member 55 and dielectric material 54 may be accomplished using adhesive, metallization, or lamination. Conductive member 55 is adapted for electrically engaging conductors 51 and 61 on circuitized substrates 52 and 62, respectively, to provide an electrical interconnection therebetween. This electrical connection may be enhanced with the use of noble metal (such as gold or palladium) plated elements 56 and/or dendritic type platings 57 which provide needle-like engagement.

Dendritic structures of this type are known and further description is not believed needed. See, e.g., U.S. Pat. No. 5,137,461 and Canadian Patent 1,121,011, both assigned to the assignee of this invention and incorporated herein by reference. Dendritic structures may also be used on first and/or second conductors 51 and 61 to enhance the electrical connection.

The preferred dielectric material 54 for substrate(s) 53 is polyimide, having a thickness of about 0.0005 inch to 0.002 inch. The conductive members 55 are preferably copper, with an approximate thickness of 0.0014 inch (commonly known as 1 ounce copper). Members 55 may be provided on the underlying dielectric by a variety of methods known in the art, including adhesive, vapor deposition (metallization) and lamination, as stated above. Further description is not believed necessary.

Figure 2:
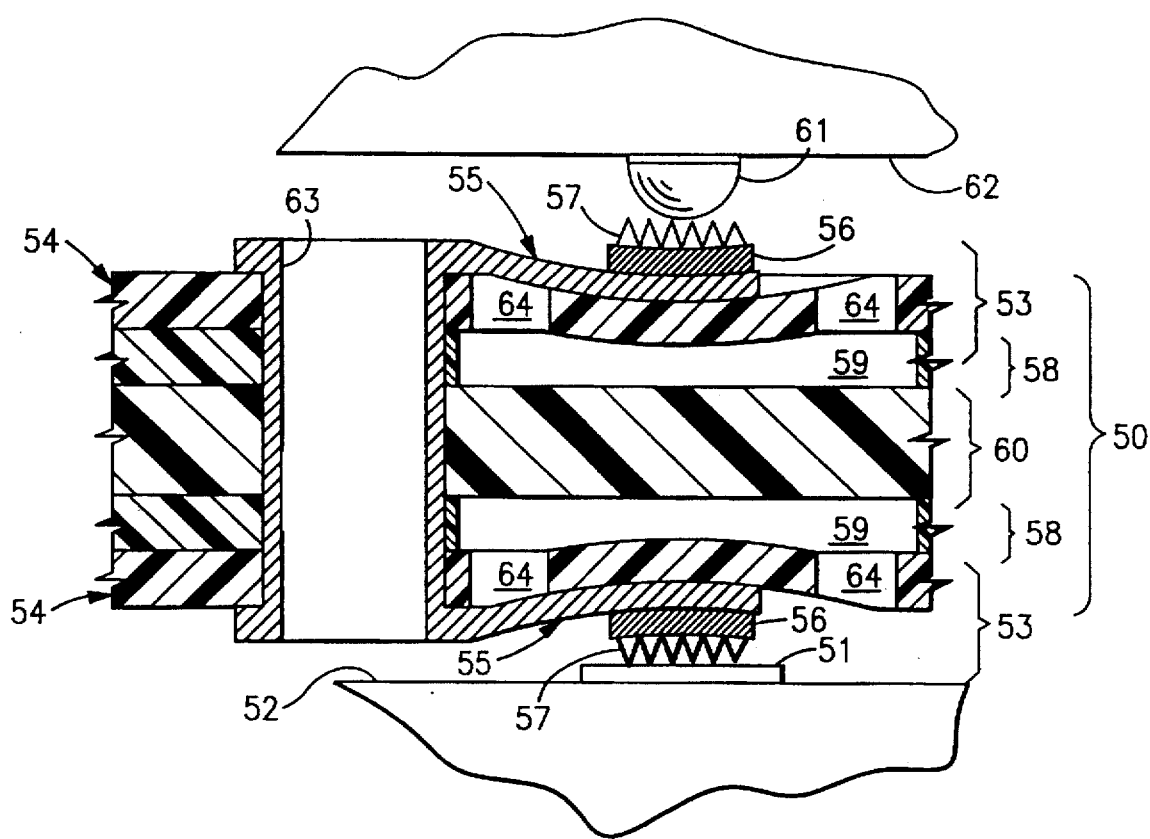
FIG. 2 is a partial, cross-sectional view of the apertured interposer structure of FIG. 1 in an actuated state.

An apertured member 58 (two shown in FIG. 1) includes at least one aperture 59 therein, the apertured member being positioned adjacent flexible circuitized substrate 53 such that the aperture 59 is aligned with a respective conductive member 55 (and 56 and/or 57 if used) on the opposite side of substrate 53, these conductive members being aligned such that when circuitized substrates 52 and 62 are engaged with interposer 50, flexible circuitized substrate 53 is depressed within aperture 59 of apertured member 58 (see FIG. 2). Apertured member 58 is preferably bonded or joined to flexible substrate 53 with an adhesive, e.g., epoxy resin, acrylic adhesive, silicone elastomer, etc. As seen in FIG. 2, the conductive members 55 are designed for being depressed within the respective, provided aperture 59.

A support member 60 is positioned adjacent apertured member 58 with both members 58 and 60 being joined or bonded together to form a composite structure similar to that formed by the bonding of substrates 53 and the respective apertured member 58 therefor. Support member 60 is preferably formed of a substantially rigid dielectric material such as fiberglass-reinforced epoxy resin, ceramic, or polyimide. Member 60 may also be of a conductive metal material for use as an electrical ground shield. Fiberglass-reinforced epoxy resin is the preferred material for use with polyimide flexible substrates.

Interposer 50 of FIG. 1 further includes a plated through hole 63 extending through flexible circuitized substrate(s) 53, apertured member 58 and support member 60 to provide an electrically conductive path through the interposer to electrically couple respective members 55 (and thus conductors 51 and 61). The plated through hole 63 can be formed by drilling a hole through the structure, cleaning, and seeding the hole, followed by plating the hole using procedures known in the art of printed circuit board manufacturing. The described electrical path completes an electrical circuit from the first conductor 51 on substrate 52 to the second conductor 61 on substrate 62 when substrates 52 and 62 are compressed onto interposer 50, as shown in FIG. 2. A suitable clamping apparatus may be used to engage the substrates and cause same to move toward one another to effect such compression.

A further embodiment of the current invention shown in FIGS. 1 and 2 includes apertures 64 within the layer of dielectric material 54 of each respective substrate 53 occupying a predetermined pattern about the respective conductive member 55. See also FIGS. 9–17 for examples of such patterns of apertures 64 relative to the respective conductor, and the underlying aperture 59. For example, in FIG. 9, three apertures 64 form a substantially circular pattern about the centrally positioned element 56 which forms part of conductor 55. Apertures 64 serve to reduce the membrane stresses and stiffness effects in dielectric material 54 of substrate 53 when interposer 50 engages substrates 52 and 62. This reduction in stiffness reduces the variation in contact force caused by height tolerance variations of different electrical paths between flexible circuit conductive members 55 (and 56 and 57, described below, if used) and the two circuitized substrate conductors 51 an 61.

Figure 3:
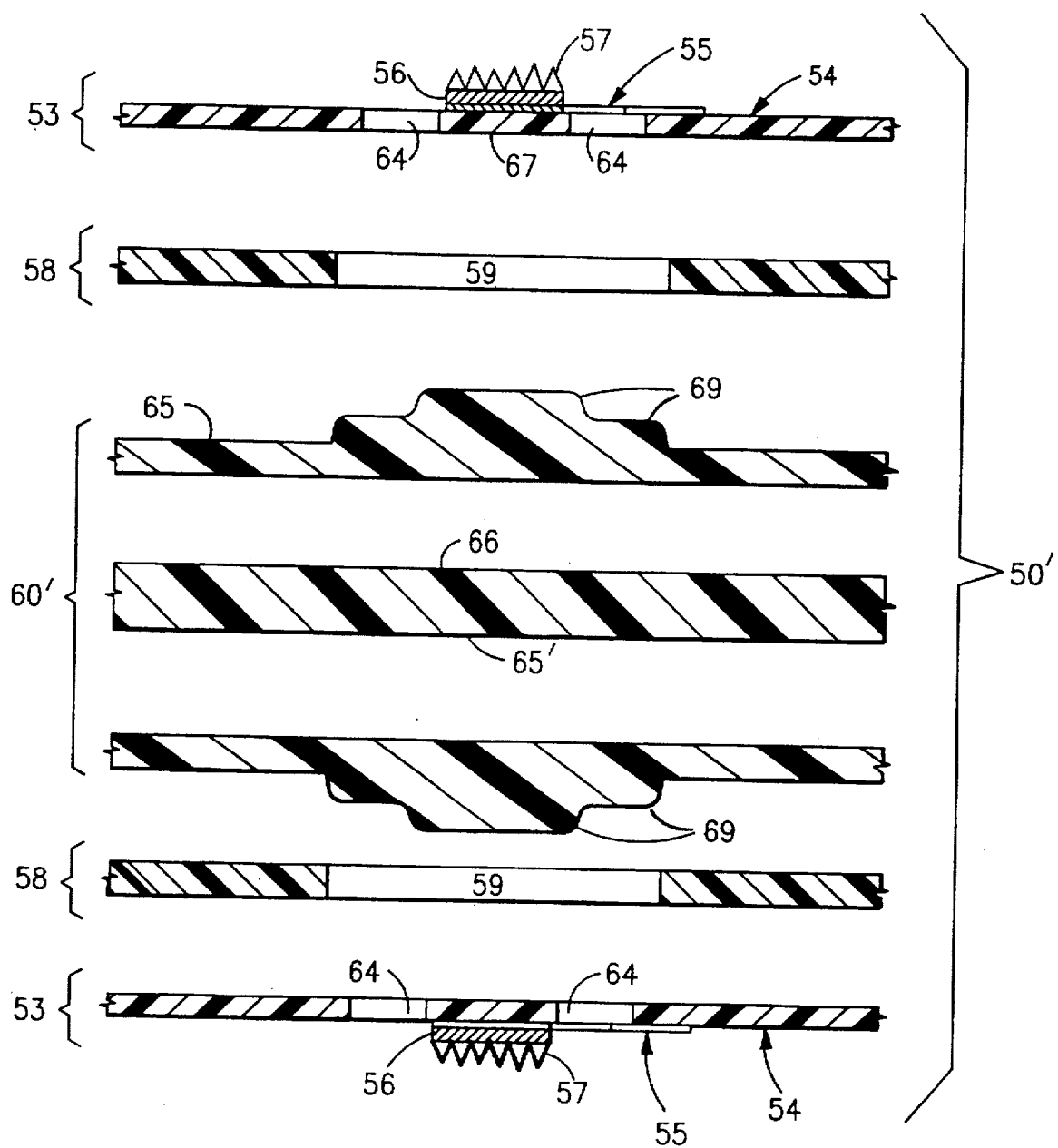
FIG. 3 is an exploded cross-sectional view of an apertured interposer according to an alternative embodiment of the invention wherein a multiple layer support member is used.
Figure 4:
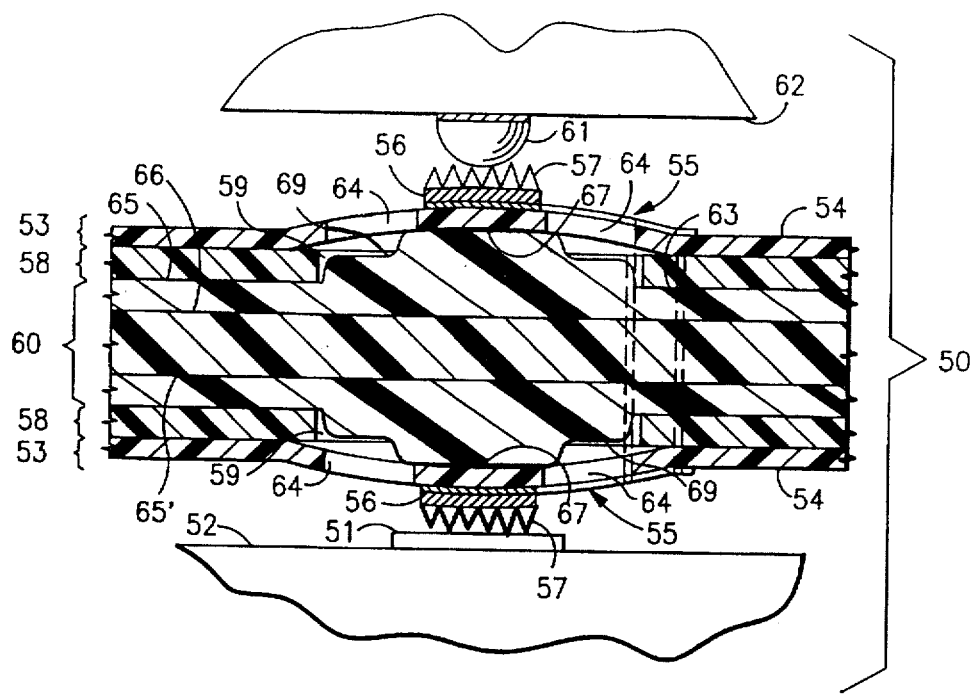
FIG. 4 is an enlarged, partial cross-sectional view of the invention of FIG. 3 further showing a plated through hole (shown by hidden lines) connecting the invention's first and second conductive members.

FIGS. 3 and 4 show exploded and assembled views, respectively, of another embodiment of the invention, this being interposer 50'. Interposer 50' includes at least one flexible substrate 53 (similar to substrate 53 in FIGS. 1 and 2), a support member 60', and an apertured member 58. In interposer 50', support member 60' is an assemblage comprised of first and second, individual support member layers 65 and 66, respectively. A third support layer 65' located on the undersurface of layer 66 may also be used if a second flexible substrate 53 is used. Such a second substrate 53 is seen at the bottom of FIGS. 3 and 4. First support member layer 65 includes a stepped, compressible portion 69 for extending through aperture 59 of apertured member 58 to engage the undersurface 67 of the dielectric material 54 of the flexible circuitized substrate 53 on the side directly opposite conductive member 55. The second support member layer 66 is of a substantially rigid construction and positioned immediately adjacent first support member layer 65. First layer 65 is preferably entirely of compressible material such as an elastomer, silicone rubber being the preferred material. The second layer 66 is preferably fabricated from a glass reinforced epoxy, but may be metallic, ceramic, polyimide or other substantially rigid material. In one embodiment, layer 65 would preferably possess an overall thickness of approximately 0.010 inch, while layer 66 would be approximately 0.005 inch thick. In FIGS. 3 and 4, a pattern of apertures 64 are also preferably used in each flexible substrate 53, similar to one of the patterns in FIGS. 9–17.

Figure 5:
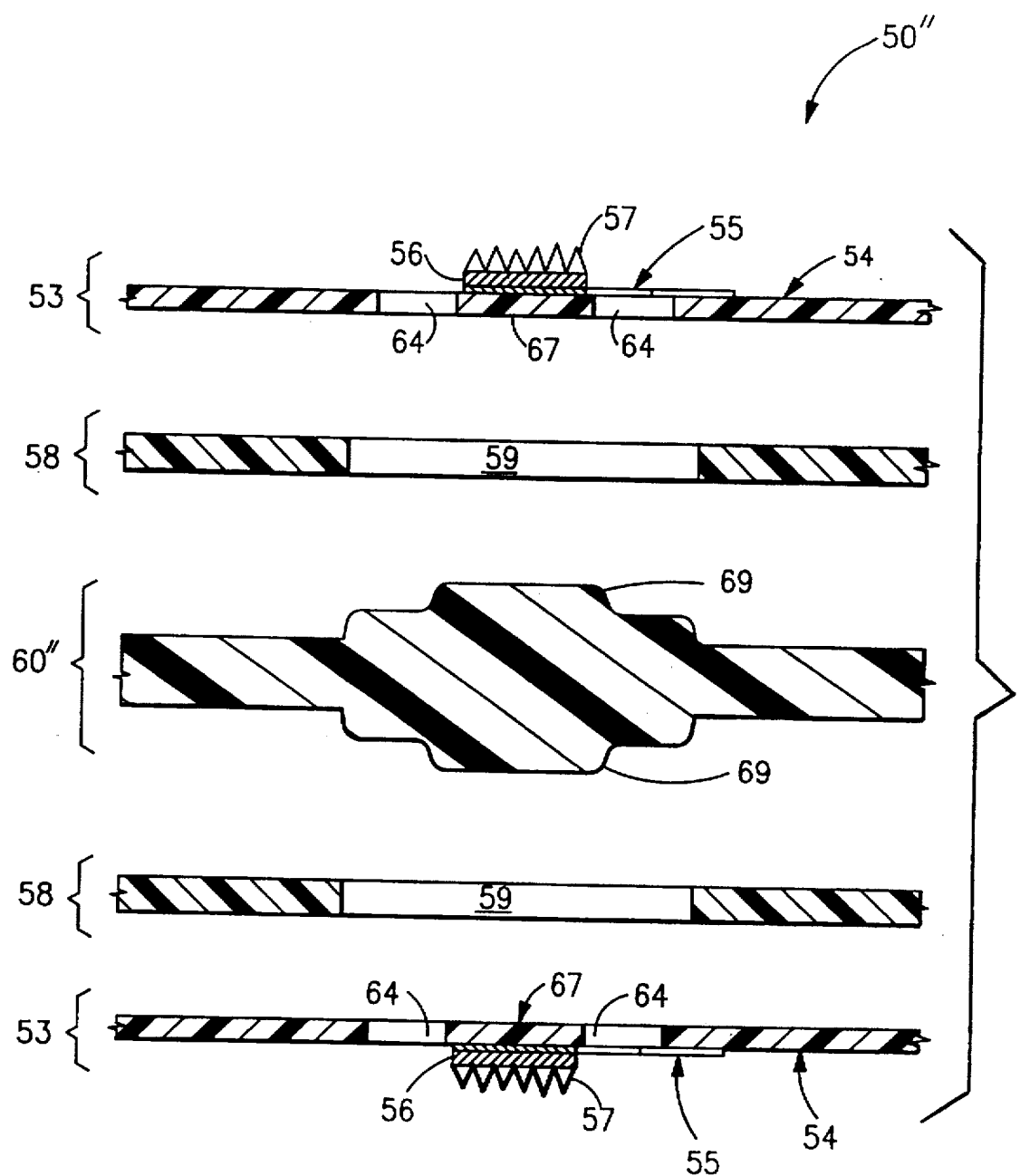
FIG. 5 is an exploded, partial cross-sectional view of an apertured interposer in accordance with another embodiment of the invention.
Figure 11:
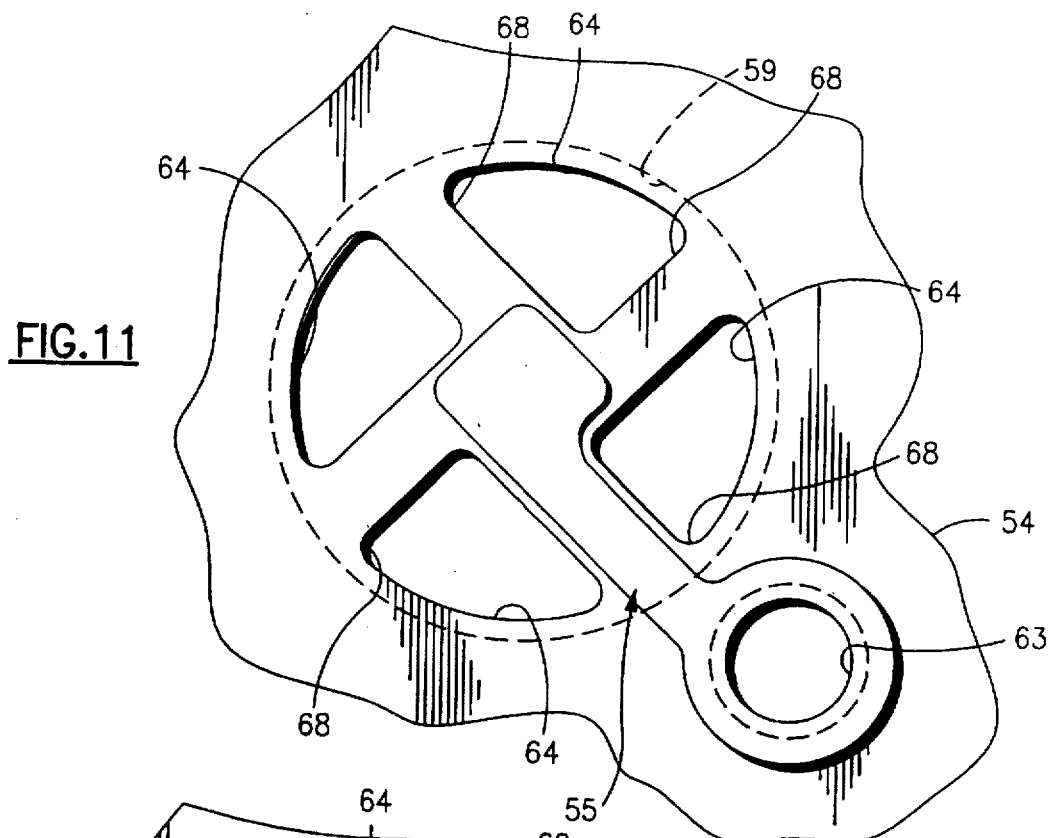

FIG. 5 shows a further embodiment of an interposer 50" in which the support member 60" is an integral, stepped member fabricated of a compressible material (such as for member 65 above) and having a stepped portion 69 adapted for extending through a respective aperture 59 extending through apertured member 58 to thereby engage the undersurface 67 of dielectric material 54 of the flexible circuitized substrate 53 on the side directly opposite conductive member 55. Support member 60 is compressed and generates contact normal force between conductor member 55 and conductors 51 and 61 (FIG. 1) when one/both of the circuitized substrates 52 and 62 engage interposer 50".

Figure 6:
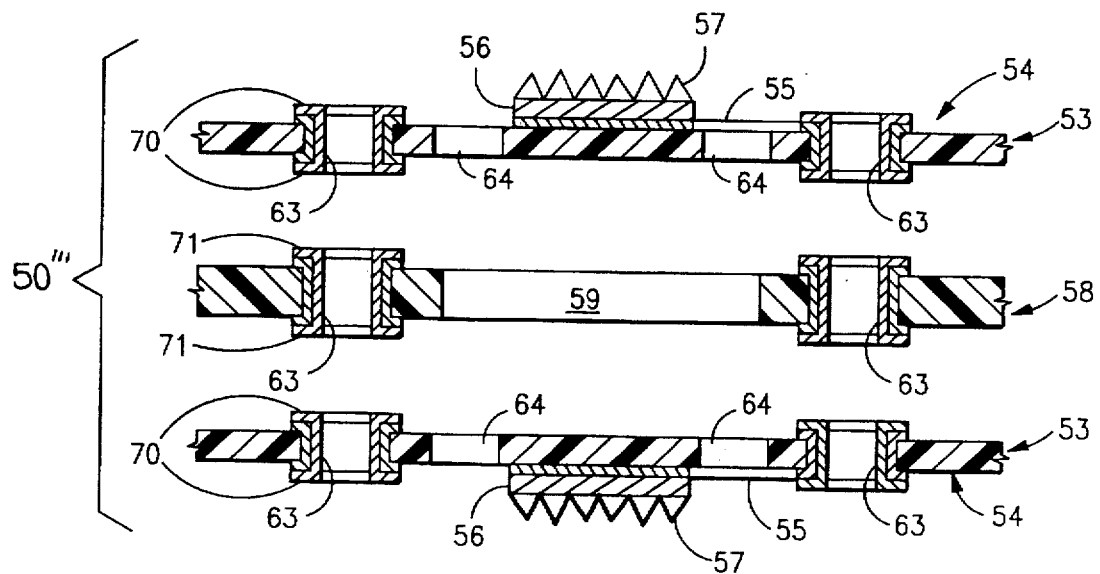
FIG. 6 is an exploded, partial cross-sectional view of an apertured interposer in accordance with yet another embodiment of the invention.

FIG. 6 is an exploded view of a further embodiment of the invention, this being interposer 50''' comprising two flexible circuitized substrates 53 and interim apertured member 58, all having plated through holes 63 extending therethrough. Aperture 59 of member 58 is substantially aligned with conductive members 55 to allow substrates 53 to deform into aperture 59 during engagement of interposer 50''' and circuitized substrates 51 and 61 (not shown). In this embodiment of the current invention, the plated through holes 63 are joined to form a mechanical and electrical connection allowing an electrical path from a first (upper) conductor 55 to a second (lower) conductor 55. The joining of the plated through holes may be done with a conductive adhesive, soldering, or transient liquid phase process as taught by U.S. Pat. No. 5,421,507, which patent is incorporated herein by reference. Both interposers 50" and 50''' preferably include patterns of apertures 64 within dielectric material 54 of one of the patterns shown in FIGS. 9–17, described herein.

By way of example, a structure formed using such a transient liquid phase process would include the plated through hole 63 of each flexible substrate 53 plated with gold (70) and the plated through hole 63 of apertured member 58 being plated with tin (71). The cylindrical axes of the three plated through holes 63 (two such pairings in FIG. 6) are substantially aligned, a clamping force is exerted on the "stack" and then the temperature of the combined parts is significantly increased. As the temperature is increased, the gold and tin interdefuse to form a bond at the mating surfaces of the plated through holes. Alternately, a tin and lead combination, e.g., a solder, could be used to form a bond.

FIGS. 7 and 8 show cross-sectional views, before and during engagement, of an alternate embodiment of the invention, this being interposer 50"". Interposer 50"" comprises a pair of flexible circuitized substrates 53 and an interim compressible support member 60"". Substrate 53 includes apertures 64 to increase the compliancy during engagement with circuitized substrates 52 and 62 (not shown). Apertures 64 are preferably of one of the patterns depicted in FIGS. 9–17. The substrates 53 are bonded to the support member 60"" by an adhesive, lamination, or vulcanization process as mentioned above. Such processes are known and further description is not needed. A plated through hole 63 or other electrical path is formed connecting respective conductive members 55. Support member 60"" is preferably of a single layer of compressible material, preferably the same material used for support members 60" (FIG. 5) and 65 (FIGS. 3,4) above.

FIG. 9 shows a preferred pattern of apertures 64 for use in the invention. As shown, apertures 64 form a substantially circular pattern (three apertures) around conductive element 56 of member 55. Aperture 59 in underlying aperture member 58 (the aperture 59 shown hidden in FIGS. 9–17) occupies a greater area than all three apertures 64. This arrangement is designed to reduce the stress concentration in the dielectric material 54. Locating the edge of apertures 64 substantially over the corresponding edge of aperture 59 serves to combine the stress concentration caused by the dielectric and the stress concentration caused by the edges of aperture 59. Removing dielectric material 54 to create apertures 64 also reduces the amount of dielectric material that must be deformed during engagement of interposer 50 with substrates 52 and 62. Reducing the amount of material that must be deformed in turn reduces the force required to deform it. Since compliance is the inverse of stiffness, reducing the stiffness increases the compliancy, allowing the interposer of the invention to accommodate a larger variation in displacement (i.e., manufacturing tolerance) for the same change in force.

FIGS. 10 through 17 show additional, alternate patterns for apertures 64 that may be successfully used in the invention's flexible circuitized substrates 53.

The aperture pattern (four apertures) shown in FIG. 10 is considered particularly significant for maximizing the compliancy of the invention's interposer. In this pattern, dielectric material 54 of flexible substrate 53 is formed in a "bent arm" pattern. This pattern allows the conductor member 55 with platings 56 and/or 57 to rotate slightly and relieve the membrane stresses created by the deflection of dielectric material 54 into aperture 59 of apertured member 58. This pattern can provide almost an eighty percent improvement in compliancy over a non-apertured flexible substrate, which may translate to an eighty percent relaxation of manufacturing tolerance specifications or the ability to reduce the spacing between conductor members 55 with the same manufacturing tolerances. As clearly seen in FIGS. 9–16, each pattern of apertures 64 is defined by a plurality of arm portions 68 that each project across the pattern to separate a respective pair of such apertures.

Figure 12:
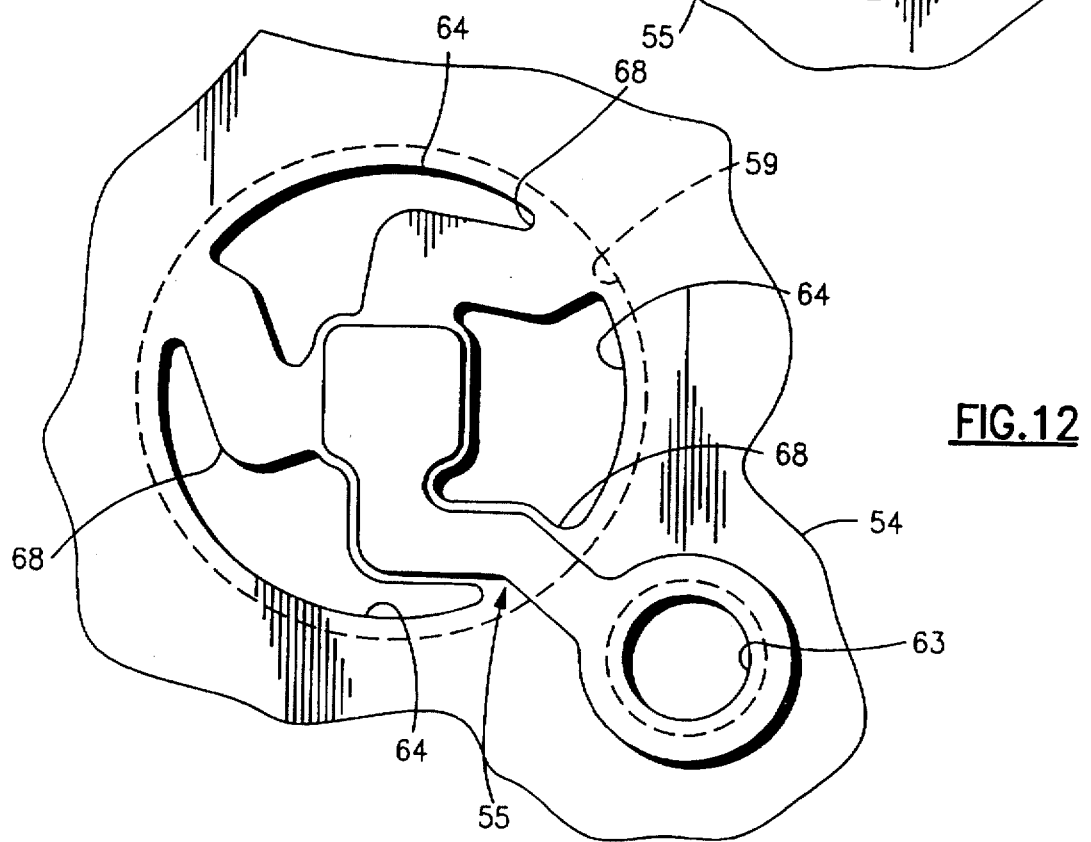
Figure 13:
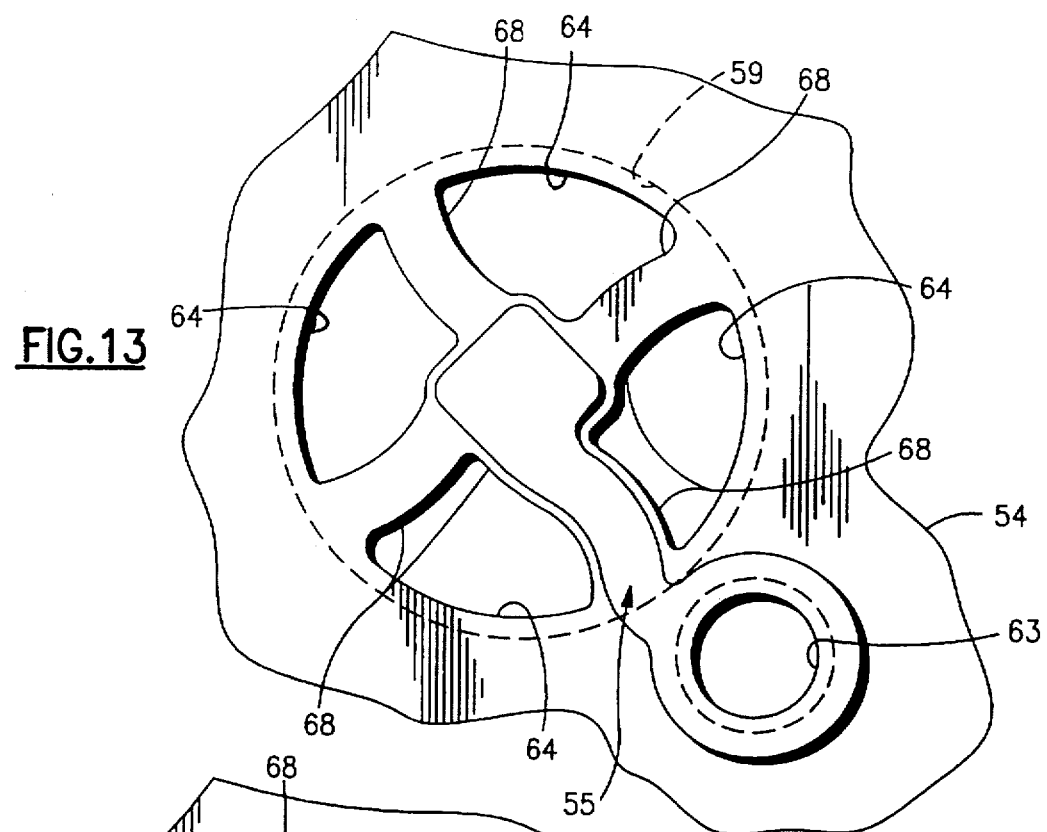
Figure 14:
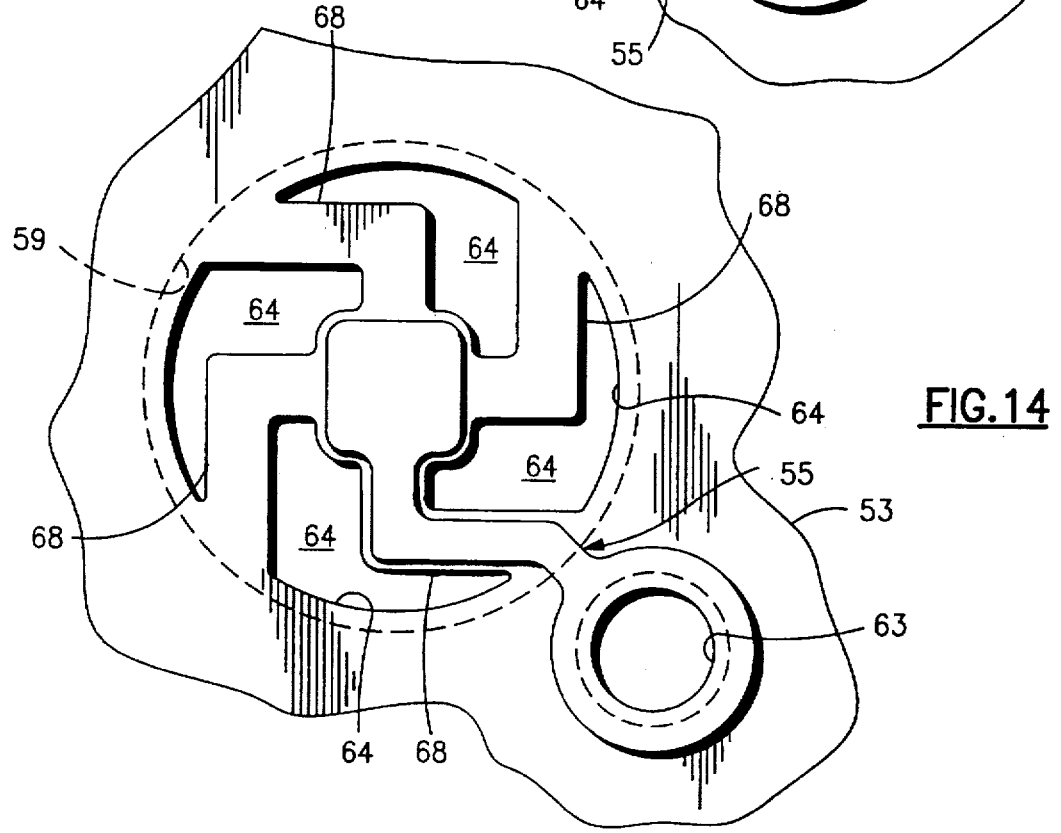
Figure 15:
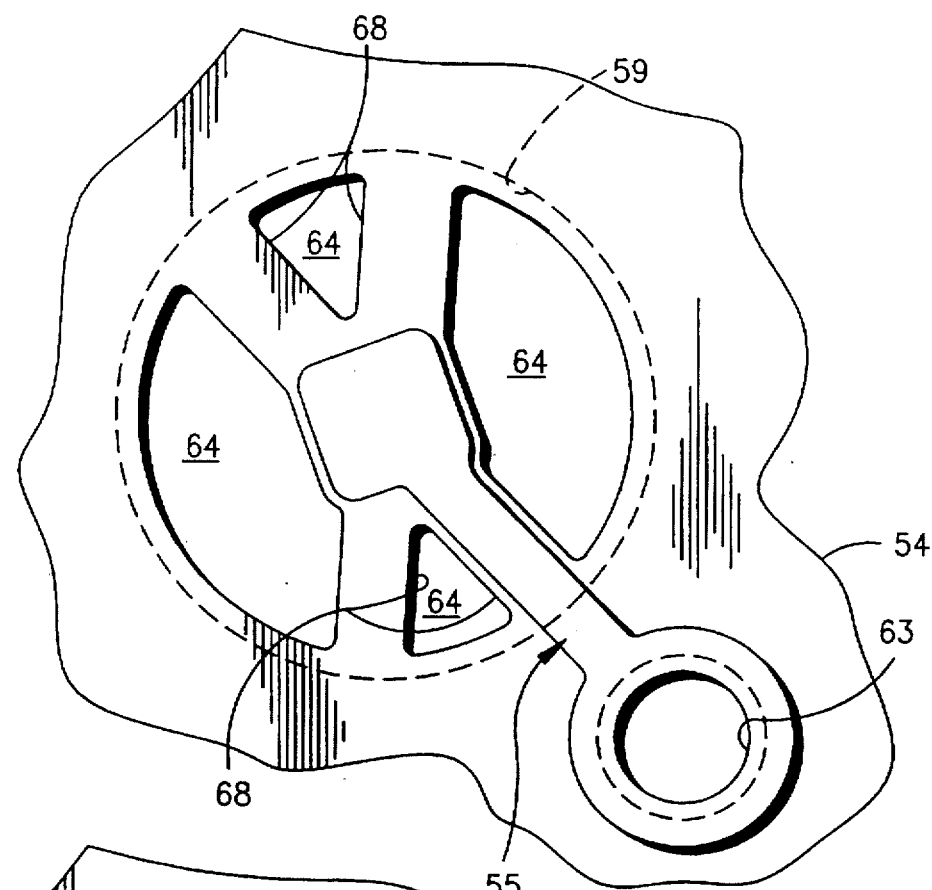
Figure 16:
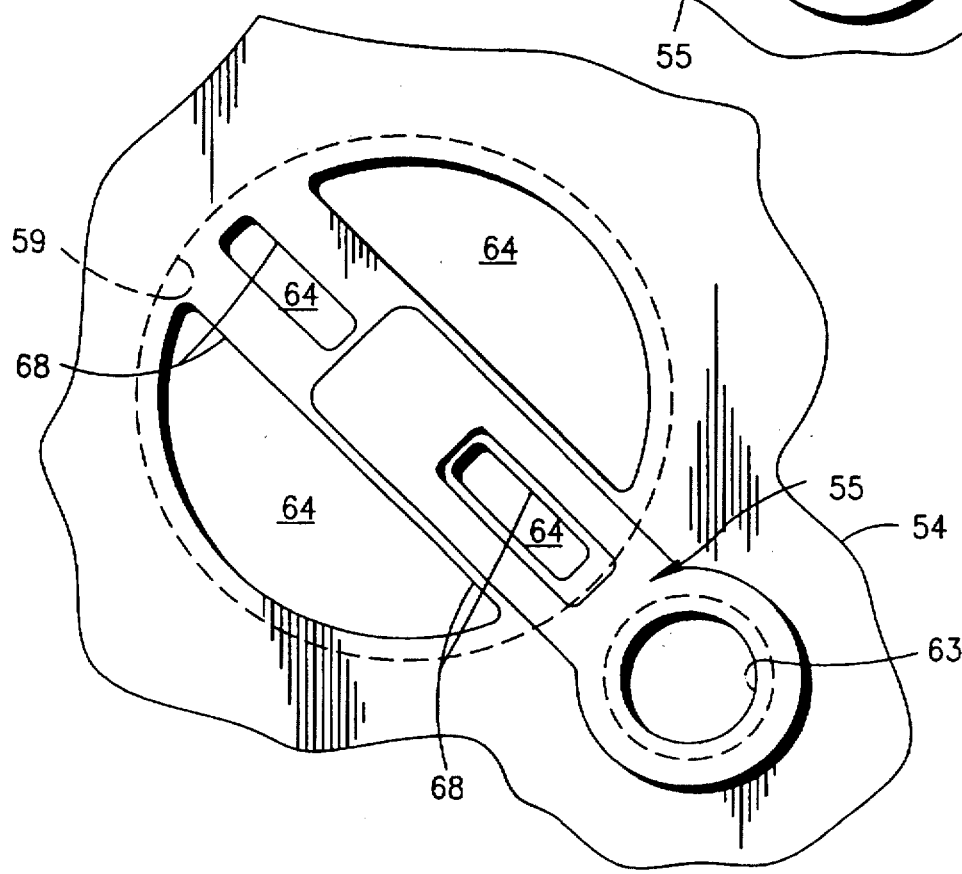
Figure 17:
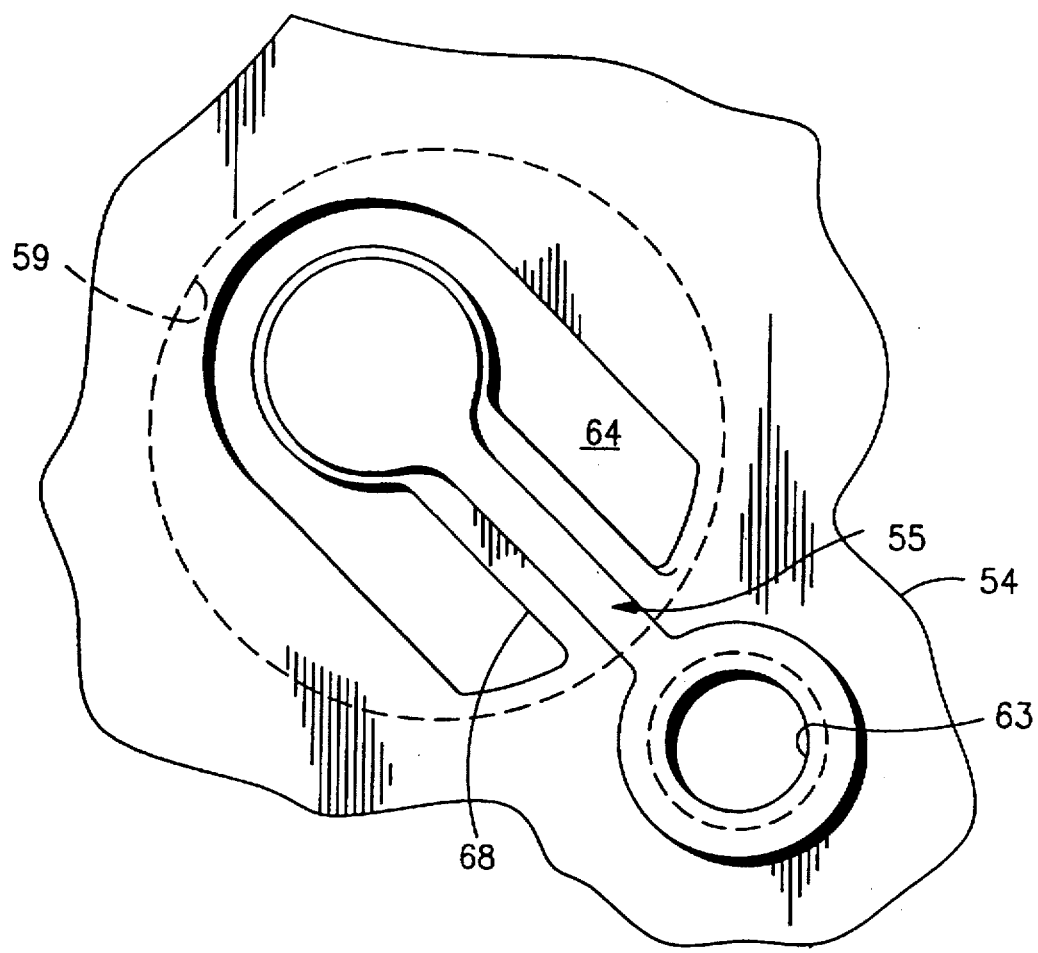

All of the patterns shown in FIGS. 9–17 are radially located substantially about the centrally deposed end segment (that having platings 56 and 57 thereon) of a respective conductive member 55. Although from one (enlarged) to four apertures per pattern are shown, the invention is not limited thereto. The patterns in FIGS. 10, 12 and 14 provide the aforementioned unique "twist" capability for the adjacent dielectric material 54. The remaining patterns of FIGS. 9, 11, 13 and 15–17, while not possessing twist capability to the extent afforded by FIGS. 10, 12 and 14, still serve to significantly reduce membrane and bending stiffnesses, thereby increasing compliancy of the respective interposer structure. It is understood from the foregoing description and corresponding FIGS. 9–17 that by the term "pattern" as used herein is meant to define a plurality of spaced apertures 64 (e.g., FIGS. 9–16) or, as in FIG. 17, a large singular aperture having at least two enlarged open portions (on opposite sides of the singular arm portion 68 in FIG. 17, the arm portion therein separating both open portions while serving to define a curvilinear, narrower open portion that connects both of these enlarged open portions).

While there have been shown and described what are at present considered the preferred embodiments of the invention, it is understood that various modifications and changes may be made thereto without departing from the scope of the invention as defined by the appended claims.

What is claimed is:

1. An interposer for electrically interconnecting first and second conductors on first and second circuitized substrates, respectively, said interposer comprising:

at least one flexible circuitized substrate adapted for being electrically coupled to said first conductor on said first circuitized substrate and including a first layer of dielectric material having at least one conductive member thereon adapted for engaging said second conductor on said second circuitized substrate to provide an electrical connection with said second conductor;

an apertured member including at least one aperture therein, said apertured member being positioned adjacent said at least one flexible circuitized substrate such that said at least one aperture is aligned with said at least one conductive member of said at least one flexible circuitized substrate on an opposite side of said flexible circuitized substrate from said conductive member, said apertured member being a separate member from said at least one flexible circuitized substrate; and a support member positioned adjacent said apertured member and having said apertured member positioned thereon, said at least one conductive member of said at least one flexible circuitized substrate adapted for being depressed within said aperture of said apertured member during the engagement between said conductive member and said first conductor of said first circuitized substrate while said apertured member is positioned on said support member.

2. The interposer of claim 1 wherein said support member is of substantially rigid construction.

3. The interposer of claim 2 wherein said support member is comprised of dielectric material.

4. The interposer of claim 2 wherein said support member is comprised of metallic material.

5. The interposer of claim 1 wherein said support member is of compressible construction.

6. The interposer of claim 5 wherein said support member is comprised of elastomeric material.

7. The interposer of claim 6 wherein said elastomeric material of said support member is silicone rubber.

8. The interposer of claim 5 wherein said support member includes a stepped portion for extending through said aperture within said apertured member to engage said layer of dielectric material on an opposite side from said conductive member.

9. The interposer of claim 5 wherein said support member is comprised of first and second support member layers, a first of said support member layers being compressible and a second of said support member layers being substantially rigid.

10. The interposer of claim 9 wherein said second of said support member layers is comprised of dielectric material.

11. The interposer of claim 10 wherein said dielectric material is polyimide.

12. The interposer of claim 1 further including a conductive through hole extending through said flexible circuitized substrate, said apertured member and said support member to provide an electrically conductive path through said interposer.

13. The interposer of claim 1 further including conductive dendritic elements positioned on said conductive member of said at least one flexible circuitized substrate member.

14. The interposer of claim 13 further including conductive dendritic elements on said second conductor of said second circuitized substrate for engaging said dendritic elements on said conductive member.

15. The interposer of claim 1 wherein said layer of dielectric material of said at least one flexible circuitized substrate includes a plurality of openings therein spaced in a predetermined pattern relative to said at least one conductive member.

16. The interposer of claim 15 wherein said openings form a substantially circular pattern around said at least one conductive member.

17. The interposer of claim 15 wherein said aperture of said apertured member is positioned adjacent said pattern of openings of said at least one flexible circuitized substrate and occupies a greater area of said apertured member then said pattern of openings within said layer of dielectric material of said at least one flexible circuitized substrate.

18. An interposer for electrically interconnecting first and second conductors on first and second circuitized substrates, respectively, said interposer comprising:

at least one flexible circuitized substrate adapted for being electrically coupled to said first conductor on said first circuitized substrate and including a first layer of dielectric material having at least one conductive member thereon adapted for engaging said second conductor on said second circuitized substrate to provide an electrical connection with said second conductor; and an apertured member including a layer of dielectric material having an aperture therein, said aperture being positioned adjacent said at least one flexible circuitized substrate such that said aperture is aligned with said at least one conductive member of said at least one flexible circuitized substrate on an opposite side of said flexible circuitized substrate from said conductive member, said apertured member being a separate member from said at least one flexible circuitized substrate, said apertured member further including a conductor member extending through said dielectric material for providing an electrically conductive path through said dielectric material of said apertured member, said conductive member of said at least one flexible circuitized substrate being electrically coupled to said conductor member and adapted for being depressed within said aperture of said apertured member during said engagement between said conductive member and said second conductor of said second circuitized substrate.

19. The interposer of claim 18 wherein said first layer of dielectric material of said at least one flexible circuitized substrate includes a plurality of openings therein spaced in a predetermined pattern relative to said at least one conductive member.

20. The interposer of claim 19 wherein said openings form a substantially circular pattern around said at least one conductive member.

21. The interposer of claim 20 wherein said aperture of said apertured member is positioned adjacent said pattern of openings of said at least one flexible circuitized substrate and occupies a greater area of said apertured member than said pattern of openings within said layer of dielectric material of said at least one flexible circuitized substrate.

22. The interposer of claim 18 wherein said conductor member extending through said dielectric material of said apertured member is a plated through hole.

23. The interposer of claim 18 further including conductive dendritic elements positioned on said conductive member of said at least one flexible circuitized substrate member.

24. The interposer of claim 23 further including conductive dendritic elements on said second conductor of said second circuitized substrate for engaging said dendritic elements on said conductive member.

25. A method of making an interposer for electrically interconnecting first and second conductors on first and second circuitized substrates, respectively, said method comprising:
providing at least one flexible circuitized substrate adapted for being electrically coupled to said first conductor on said first circuitized substrates and including a first layer of dielectric material having at least one conductive member thereon adapted for engaging said second conductor on said second circuitized substrate to provide an electrical connection with said second conductor;
providing an apertured member including at least one aperture therein, and positioning said apertured member adjacent said at least one flexible circuitized substrate such that said at least one aperture is aligned with said one conductive member of said at least one flexible circuitized substrate on an opposite side of said flexible circuitized substrate from said conductive member, said apertured member being a separate member from said at least one flexible circuitized substrate; and
providing a support member adjacent said apertured member and positioning said apertured member on said support member such that said at least one flexible circuitized substrate may be depressed within said aperture of said apertured member during said engagement between said conductive member and said second conductor of said second circuitized substrate when said apertured member is positioned on said support member.

26. The method of claim 25 further including bonding said at least one flexible circuitized substrate to said adjacent apertured member using an adhesive.

27. The method of claim 25 further including bonding said apertured member to said adjacent support member using an adhesive.

28. The method of claim 25 further including joining said at least one flexible circuitized substrate to said adjacent apertured member using a lamination process.

29. The method of claim 25 further including joining said apertured member to said adjacent support member using a lamination process.

30. The method of claim 25 further including providing at least one electrically conductive, plated through hole through said support member.

31. The method of claim 30 wherein said plated through hole is provided in said support member by drilling a hole within said support member and thereafter plating said hole with electrically conductive material.

32. The method of claim 30 further including providing a conductor member within said at least one flexible circuitized substrate electrically connected to said at least one conductive member and thereafter joining said conductor member of said at least one flexible circuitized substrate using a transient liquid phase process.

33. A method of making an interposer for electrically interconnecting first and second conductors on first and second circuitized substrates, respectively, said method comprising:
providing at least one flexible circuitized substrate adapted for being electrically coupled to said first conductor on said first circuitized substrate and including a first layer of dielectric material having at least one conductive member thereon adapted for engaging said second conductor on said second circuitized substrate to provide an electrical connection with said second conductor;
providing an apertured member including at least one aperture therein, and positioning said apertured member adjacent said at least one flexible circuitized substrate such that said at least one aperture is aligned with said one conductive member of said at least one flexible circuitized substrate on an opposite side of said flexible circuitized substrate from said conductive member, said apertured member being a separate member from said at least one flexible circuitized substrate;
providing a conductor extending through said apertured member and electrically coupling said conductor to said conductive member of said at least one flexible circuitized member; and
positioning said apertured member such that said at least one flexible circuitized substrate may be depressed within said aperture of said apertured member during engagement between said conductive member and said second conductor of said second circuitized substrate.

34. The method of claim 33 further including bonding said at least one flexible circuitized substrate to said adjacent apertured member using an adhesive.

35. The method of claim 33 further including joining said at least one flexible circuitized substrate to said adjacent apertured member using a lamination process.

36. The method of claim 33 further including providing at least one electrically conductive, plated through hole through said apertured member.

37. The method of claim 36 wherein said plated through hole is provided in said aperture by drilling a hole within said apertured member and thereafter plating said hole with electrically conductive material.

38. The method of claim 36 further including providing a conductor member within said at least one flexible circuitized substrate electrically connected to said at least one conductive member and thereafter joining said conductor member of said at least one flexible circuitized substrate to said conductor member of said apertured member using a transient liquid phase process.

39. An electrical assembly comprising:

first and second circuitized substrates including thereon first and second conductors, respectively; and an interposer including at least one flexible circuitized substrate adapted for being electrically coupled to said first conductor on said first circuitized substrate and including a first layer of dielectric material having at least one conductive member thereon adapted for engaging said second conductor on said second circuitized substrate to provide an electrical connection with said second conductor, an apertured member including at least one aperture therein, said apertured member being positioned adjacent said at least one flexible circuitized substrate such that said at least one aperture is aligned with said at least one conductive member of said at least one flexible circuitized substrate on an opposite side of said flexible circuitized substrate from said conductive member, said apertured member being a separate member from said at least one flexible circuitized substrate, and a support member positioned adjacent said apertured member and having said apertured member positioned thereon, said at least one conductive member of said at least one flexible circuitized substrate adapted for being depressed within said aperture of said apertured member during the engagement between said conductive member and said first conductor of said first circuitized substrate while said apertured member is positioned on said support member.

40. An electrical assembly comprising:

first and second circuitized substrates including thereon first and second conductors, respectively; and an interposer including at least one flexible circuitized substrate adapted for being electrically coupled to said first conductor on said first circuitized substrate and including a first layer of dielectric material having at least one conductive member thereon adapted for engaging said second conductor on said second circuitized substrate to provide an electrical connection with said second conductor, and an apertured member including a layer of dielectric material having an aperture therein, said aperture being positioned adjacent said at least one flexible circuitized substrate such that said aperture is aligned with said at least one conductive member of said at least one flexible circuitized substrate on an opposite side of said flexible circuitized substrate from said conductive member, said apertured member being a separate member from said at least one flexible circuitized substrate, said apertured member further including a conductor member extending through said dielectric material for providing an electrically conductive path through said dielectric material of said apertured member, said conductive member of said at least one flexible circuitized substrate being electrically coupled to said conductor member and adapted for being depressed within said aperture of said apertured member during said engagement between said conductive member and said second conductor of said second circuitized substrate.

* * * * *